(12) United States Patent
Yonekawa

(10) Patent No.: US 10,444,646 B2
(45) Date of Patent: Oct. 15, 2019

(54) LITHOGRAPHY APPARATUS AND METHOD OF MANUFACTURING ARTICLE

(71) Applicant: CANON KABUSHIKI KAISHA, Tokyo (JP)

(72) Inventor: Masami Yonekawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/107,864

(22) Filed: Aug. 21, 2018

(65) Prior Publication Data

US 2019/0064682 A1 Feb. 28, 2019

(30) Foreign Application Priority Data

Aug. 25, 2017 (JP) .................................. 2017-162178

(51) Int. Cl.
*G03F 7/20* (2006.01)
*G03F 7/00* (2006.01)

(52) U.S. Cl.
CPC ........ *G03F 7/70925* (2013.01); *G03F 7/0002* (2013.01); *G03F 7/707* (2013.01); *G03F 7/70708* (2013.01); *G03F 7/70775* (2013.01); *G03F 7/70825* (2013.01); *G03F 7/70933* (2013.01)

(58) Field of Classification Search
CPC ......................... G03F 7/70925; G03F 7/70933
See application file for complete search history.

(56) References Cited

U.S. PATENT DOCUMENTS

| 5,559,582 | A | * | 9/1996 | Nishi | G03F 7/707 355/30 |
| 5,825,470 | A | * | 10/1998 | Miyai | G03F 7/707 355/72 |
| 6,176,770 | B1 | * | 1/2001 | Kao | B24B 55/10 451/388 |
| 6,249,932 | B1 | * | 6/2001 | Chu | A47L 9/08 15/345 |
| 8,027,017 | B2 | * | 9/2011 | Ryu | B08B 1/007 134/1.3 |
| 2002/0012112 | A1 | * | 1/2002 | Yamada | G03F 7/707 355/72 |
| 2003/0184720 | A1 | * | 10/2003 | Heerens | G03F 7/707 355/53 |
| 2004/0165160 | A1 | * | 8/2004 | Van Beek | B08B 7/0057 355/30 |
| 2007/0091287 | A1 | * | 4/2007 | Chang | G03F 7/70341 355/30 |

(Continued)

FOREIGN PATENT DOCUMENTS

JP 8-115868 A 5/1996
JP 9-283418 A 10/1997

*Primary Examiner* — Steven Whitesell Gordon
(74) *Attorney, Agent, or Firm* — Canon U.S.A. Inc., IP Division

(57) ABSTRACT

A lithography apparatus that forms a pattern on a substrate, and the lithography apparatus includes: a holding unit that holds the substrate; and a cleaning member that brings a polishing unit into contact with the holding unit to clean the holding unit, in which the cleaning member includes a supply port which is arranged in the polishing unit and through which gas is supplied, and a suction port which is arranged in a periphery of the polishing unit and through which gas is sucked.

12 Claims, 13 Drawing Sheets

(56) References Cited

U.S. PATENT DOCUMENTS

2010/0183987 A1* 7/2010 Yonekawa .......... G03F 7/70866
　　　　　　　　　　　　　　　　　　　　　　430/325
2010/0214549 A1* 8/2010 Cadee .................. B24B 31/112
　　　　　　　　　　　　　　　　　　　　　　355/72

* cited by examiner

LITHOGRAPHY APPARATUS AND METHOD OF MANUFACTURING ARTICLE

BACKGROUND OF THE INVENTION

Field of the Invention

The present disclosure relates to a lithography apparatus and a method of manufacturing an article.

Description of the Related Art

As a request for miniaturization of a semiconductor device, MEMS, or the like increases, in addition to a conventional photolithography technique, a microfabrication technique in which an imprint material on a substrate is molded by using a mold and a pattern of the imprint material is formed on the substrate is attracting attention. This technique is also referred to as an imprint technique, and enables to form a fine structure on the order of several nanometers on the substrate. An example of the imprint technique includes a photo-curing method. An imprint apparatus that employs the photo-curing method firstly applies a photo-curable imprint material to a shot region, which is an imprint region, on a substrate. Next, a pattern portion of a mold (original) is brought into contact with (impressed against) the imprint material while the pattern portion of the mold and the shot region are positioned, and the imprint material is filled in the pattern portion. Then, after the imprint material is cured by irradiation of light, the pattern portion of the mold and the imprint material are separated from each other, so that a pattern of the imprint material is formed in the shot region on the substrate.

In such an imprint apparatus, higher flatness of the substrate is required to form a fine structure on the substrate. When flatness of a holding surface of a substrate chuck that holds the substrate is reduced, however, the flatness of the substrate held by the substrate chuck may be reduced. The reduction in the flatness of the holding surface of the substrate chuck is caused by, for example, attachment of a foreign substance onto the holding surface of the substrate chuck.

Then, Japanese Patent Laid-Open No. 8-115868 discloses a technique of cleaning a holding surface of a substrate chuck. In a state where abrasive having high hardness and abrasive containing an organic material are brought into contact with a wafer chuck with a given pressure, such abrasive is caused to frictionally slide with the wafer chuck by a planetary gear method. Moreover, in Japanese Patent Laid-Open No. 9-283418, a cleaning plate in which a grid groove is cut is brought into contact with a wafer chuck in an appropriate pressurization condition to relatively move with the wafer chuck.

FIG. 16 is a cross-sectional view of a substrate chuck and a cleaning member. In a state where a polishing pad 161 which is arranged on a lower surface of the cleaning member and a substrate chuck 102 are brought into contact with each other, the polishing pad 161 or the substrate chuck 102 is moved, so that a foreign substance 360 attached to a surface (hereinafter, referred to as a holding surface) of the substrate chuck 102, on which a substrate is held, is able to be removed. On the holding surface of the substrate chuck 102, a plurality of protrusions are formed in order to make an area where the substrate chuck 102 contacts the substrate as small as possible so that no foreign substance is held between the substrate and the holding surface. Thus, particles 350 that are generated when the holding surface is cleaned may be attached to spaces between the plurality of protrusions. When the substrate chuck 102 moves, for example, the particles 350 attached to the spaces between the plurality of protrusions may drift in a space inside an imprint apparatus and be attached onto the substrate or to a pattern portion of a mold. The particles 350 attached onto the substrate or to the pattern portion of the mold may cause a defective pattern or breakage of the pattern portion.

In Japanese Patent Laid-Open No. 8-115868, a unit for cleaning is covered with a shielding cover and an exhaust duct is provided in the shielding cover to suck air, so that particles generated through cleaning are sucked. However, in a case where the particles are attached to the substrate chuck again, it may be difficult to suck the attached particles through the exhaust duct provided in the shielding cover. Moreover, in Japanese Patent Laid-Open No. 9-283418, one hole used for sucking with negative pressure is provided in a cleaning member and particles are removed by sucking the particles through the hole. However, even when air is sucked by using negative pressure through the one hole used for sucking with negative pressure, an efficient flow of gas is hard to be generated in a narrow space between the cleaning member and the substrate chuck and it may be difficult to suck particles at positions away from the hole used for sucking with negative pressure.

SUMMARY OF THE INVENTION

The disclosure provides a lithography apparatus capable of efficiently removing particles generated by cleaning of a substrate chuck and a method of manufacturing an article.

A lithography apparatus as an aspect of the disclosure is a lithography apparatus that forms a pattern on a substrate, and includes a holding unit that holds the substrate, and a cleaning member that brings a polishing unit into contact with the holding unit to clean the holding unit, in which the cleaning member includes a supply port which is arranged in the polishing unit and through which gas is supplied, and a suction port which is arranged in a periphery of the polishing unit and through which gas is sucked.

Further features of the present disclosure will become apparent from the following description of exemplary embodiments with reference to the attached drawings.

DESCRIPTION OF THE EMBODIMENTS

Figure 1:
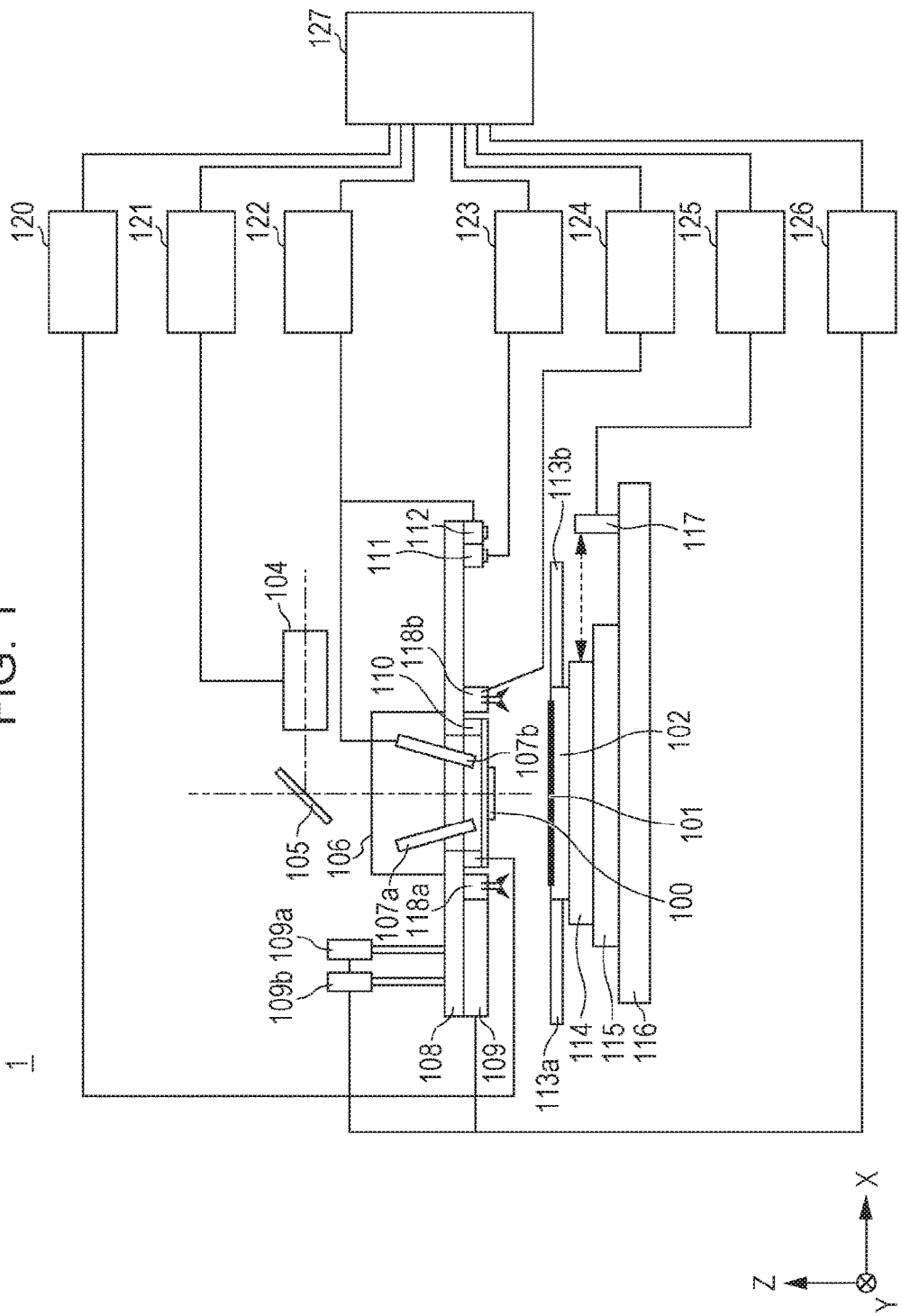
FIG. 1 illustrates an imprint apparatus according to Embodiment 1.

Hereinafter, desirable embodiments of the disclosure will be described in detail with reference to drawings. In the following embodiments, an example in which an imprint apparatus is used as a lithography apparatus will be described. In the drawings, the same member is given the same reference sign and redundant description will be omitted.

[Embodiment 1]

FIG. 1 illustrates an imprint apparatus according to Embodiment 1. First, a representative apparatus configuration of the imprint apparatus according to Embodiment 1 will be described with reference to FIG. 1. An imprint apparatus 1 is an apparatus that brings an imprint material supplied onto a substrate 101 and a mold 100 (original) into contact with each other and applies curing energy to the imprint material, thereby forming a pattern of a cured product to which a concave-convex pattern of the mold 100 is transferred.

Here, a curable composition (also referred to as uncured resin) that is cured by receiving curing energy is used for the imprint material. An electromagnetic wave, heat, or the like is used as the curing energy. For example, light, such as infrared light, visible rays, or ultraviolet light, whose wavelength is selected from a range of 150 nm or more to 1 mm or less is used as the electromagnetic wave.

The curable composition is a composition that is cured by light irradiation or heating. A photo-curable composition that is cured by light contains at least a polymerizable compound and a photopolymerization initiator, and may contain a non-polymerizable compound or solvent as needed. The non-polymerizable compound is at least a material selected from a group of a sensitizer, a hydrogen donor, an internal mold release agent, a surfactant, an antioxidant, a polymer component, and the like.

The imprint material is applied onto the substrate 101 in a film shape by a spin coater or a slit coater. Alternatively, a liquid injection head may apply, onto the substrate, the imprint material having a droplet shape, or an island shape or a film shape formed by a plurality of droplets connected to each other. A viscosity (viscosity at 25° C.) of the imprint material is, for example, 1 mPa·s or more to 100 mPa·s or less.

For the substrate 101, glass, ceramics, a metal, resin, or the like is used, and a member made of a material different from that of the substrate 101 may be formed on a surface of the substrate 101 as needed. Specifically, a silicon wafer, a compound semiconductor wafer, a glass wafer containing quartz as a material, or the like is used as the substrate 101.

The mold 100 has a rectangular outer periphery shape, and includes a pattern portion having a pattern (a concave-convex pattern, such as a circuit pattern, to be transferred onto the substrate 101) that is three-dimensionally formed on a surface (pattern surface) which faces the substrate 101. The mold 100 is formed of a material, which is able to transmit light, for example, quartz.

The present embodiment will be described by assuming that the imprint apparatus 1 employs a photo-curing method in which the imprint material is cured by light irradiation. Hereinafter, it is assumed that a direction in which the imprint material on the substrate 101 is irradiated with light and which is parallel to an optical axis of an irradiation optical system described below is a Z axis direction and two directions orthogonal to each other in a plane perpendicular to the Z axis direction are an X axis direction and a Y axis direction.

Each unit of the imprint apparatus 1 will be described with reference to FIG. 1. A mold holding device 110 includes a mold chuck (not illustrated) that attracts and holds the mold 100 with a vacuum suction force or an electrostatic force and a mold moving mechanism (not illustrated) that holds the mold chuck and moves the mold 100 (mold chuck). Each of the mold chuck and the mold moving mechanism has a center portion (inner side) having an opening through which light from an irradiation unit 104 is irradiated to the imprint material on the substrate 101. The mold moving mechanism moves the mold 100 in the Z axis direction while selectively pressing (impressing) the mold 100 against the imprint material on the substrate 101 and separating (releasing) the mold 100 from the imprint material on the substrate 101. An actuator applicable to the mold moving mechanism includes, for example, a linear motor or an air cylinder. In order to position the mold 100 with high accuracy, the mold moving mechanism may be constituted by a plurality of driving systems such as a coarse-movement drive system and a fine-movement drive system. Moreover, the mold moving mechanism may be configured so as to be able to move the mold 100 not only in the Z axis direction but also in the X axis direction or the Y axis direction. Further, the mold moving mechanism may be configured to have a tilt function of adjusting a position of the mold 100 in a θ direction (rotational direction about the Z axis) or inclination of the mold 100. The mold holding device 110 is controlled by a first control unit 120.

The irradiation unit 104 has a light source (not illustrated) and an irradiation optical system (not illustrated) and the irradiation optical system includes one in which optical elements described below are combined. The irradiation unit 104 irradiates the imprint material on the substrate 101 with light (for example, ultraviolet light) via the mold 100 in imprinting processing. The irradiation unit 104 includes the light source and the optical elements (such as a lens, a mirror, and a light-shielding plate) that adjust light from the light source to be brought into a light state (such as light intensity distribution or an illumination region) appropriate for the imprinting processing. Since the photo-curing method is employed in the present embodiment, the imprint apparatus 1 has the irradiation unit 104. However, in a case where a heat-curing method is employed, the imprint apparatus 1 includes a heat source for curing an imprint material (thermally curable imprint material), instead of the irradiation unit 104. The irradiation unit 104 is controlled by a second control unit 121.

Alignment scopes 107a and 107b measure position misalignment in the X axis direction and the Y axis direction between an alignment mark formed on the substrate 101 and an alignment mark formed on the mold 100. The alignment scopes 107a and 107b are formed in an imprint head unit 106. The alignment scopes 107a and 107b are controlled by a third control unit 122. The third control unit 122 acquires the misalignment measured by the alignment scopes 107a and 107b. The alignment scopes 107a and 107b are also able to measure a shape of the pattern portion of the mold 100 or a shape of a shot region formed on the substrate 101. Thus, the alignment scopes 107a and 107b function also as measurement units that measure an alignment state between a region of the substrate 101 that is targeted to imprinting processing and the pattern portion of the mold 100. In the present embodiment, the alignment scopes 107a and 107b measure a shape difference between the pattern portion of the mold 100 and the shot region formed on the substrate 101. A second alignment scope 112 is an off-axis alignment scope and performs global alignment as needed. The second alignment scope 112 is also controlled by the third control unit 122.

A liquid ejection device 111 supplies an imprint material onto the substrate 101 on the basis of supply amount information that is set in advance. A supply amount (that is, supply amount information) of the imprint material supplied from the liquid ejection device 111 is set in accordance with, for example, a thickness (a thickness of a residual layer) of a pattern of the imprint material formed on the substrate 101, a density of the pattern of the imprint material, or the like. The liquid ejection device 111 is controlled by a fourth control unit 123.

Gas supply mechanisms 118a and 118b have a function of supplying gas so that particles generated inside the imprint apparatus 1 do not enter into the mold 100 or a periphery of the substrate 101. The gas supply mechanisms 118a and 118b are controlled by a fifth control unit 124.

The substrate chuck 102 (holding unit) attracts and holds the substrate 101 with a vacuum suction force or an electrostatic force. Plate members 1113a and 113b are arranged around the substrate chuck 102 so as to surround the substrate 101 and to be at the same height as the substrate 101. The substrate chuck 102 is mounted on a fine-movement stage 114 and the fine-movement stage 114 is mounted on a coarse-movement stage 115. The fine-movement stage 114 and the coarse-movement stage 115 are movable in an X-Y plane. By adjusting positions of the fine-movement stage 114 and the coarse-movement stage 115 when the mold 100 is pressed against the imprint material on the substrate 101, the position of the mold 100 and the position of the substrate 101 are aligned with each other. An actuator applicable to each of the fine-movement stage 114 and the coarse-movement stage 115 includes, for example, a linear motor or an air cylinder. The fine-movement stage 114 and the coarse-movement stage 115 may be configured to be able to move the substrate 101 not only in the X axis direction and the Y axis direction but also in the Z axis direction. Note that, impressing and releasing of the mold 100 in the imprint apparatus 1 are realized by moving the mold 100 in the Z axis direction. However, the impressing and the releasing may be realized by moving the substrate 101 in the Z axis direction. Additionally, the impressing and the releasing of the mold 100 may be realized by relatively moving both the mold 100 and the substrate 101 in the Z axis direction. Further, the fine-movement stage 114 and the coarse-movement stage 115 may be configured to have a tilt function of adjusting the position of the substrate 101 in a 0 direction (rotational direction about the Z axis) or inclination of the substrate 101. The positions of the fine-movement stage 114 and the coarse-movement stage 115 are monitored by a stage interferometer 117. The fine-movement stage 114, the coarse-movement stage 115, and the stage interferometer 117 are controlled by a sixth control unit 125.

A cleaning unit 109 cleans a surface of the substrate chuck 102 when flatness of the substrate chuck 102 is reduced, for example, due to a foreign substance being attached to a substrate holding surface of the substrate chuck 102. The cleaning unit 109 has a cleaning member 150 that contacts the substrate chuck 102 to clean the substrate holding surface of the substrate chuck 102 and a Z driving mechanism (not illustrated) that moves the cleaning member 150 in the Z axis direction. Moreover, the cleaning unit 109 is connected to a supply unit 109a, which supplies gas, via a pipe through which the gas is supplied. The cleaning unit 109 is connected to a suction unit 109b, which sucks gas, via a pipe through which gas the is sucked. The cleaning unit 109, the supply unit 109a, and the suction unit 109b are controlled by a seventh control unit 126.

A main control unit 127 is constituted by a computer including a CPU, a memory, and the like, and controls the control units such as the first control unit 120, the second control unit 121, the third control unit 122, the fourth control unit 123, the fifth control unit 124, and the sixth control unit 125 in accordance with a program stored in the memory. That is, the main control unit 127 controls an operation, adjustment, and the like of each of the units of the imprint apparatus 1. The main control unit 127 may be constituted by a computer different from a computer constituting each of the control units such as the first control unit 120 or may be constituted by a computer common with at least one of the control units such as the first control unit 120. The main control unit 127 may be constituted integrally (or constituted in a common housing) with other portions of the imprint apparatus 1 or may be constituted separately (or constituted in a different housing) from other portions of the imprint apparatus 1.

The imprint apparatus 1 has a base surface plate 116 on which the coarse-movement stage 115 and the like are mounted and a bridge surface plate 108 that fixes the mold holding device 110 and the like.

Figure 2:
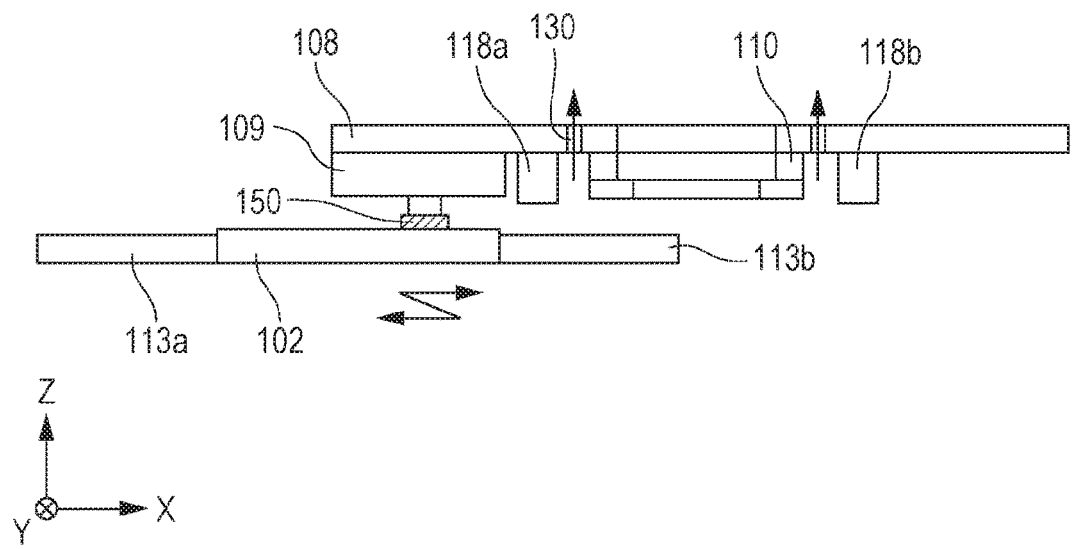
FIG. 2 illustrates a cleaning unit according to Embodiment 1.

FIG. 2 illustrates the cleaning unit 109 according to Embodiment 1. In a case where the cleaning unit 109 cleans the substrate chuck 102, the fine-movement stage 114 and the coarse-movement stage 115 are moved, so that the substrate chuck 102 is positioned below the cleaning unit 109. Then, the Z driving mechanism of the cleaning unit 109 moves the cleaning member 150 in a lower direction (a negative direction of the Z axis) to bring the cleaning member 150 and the substrate chuck 102 into contact with each other. At this time, the Z driving mechanism of the cleaning unit 109 presses the cleaning member 150 against the substrate chuck 102 with a given force. At least one of the fine-movement stage 114 and the coarse-movement stage 115 may move the substrate chuck 102 in an upper direction (a positive direction of the Z axis) to press the cleaning member 150 against the substrate chuck 102 with a given force.

Figure 3:
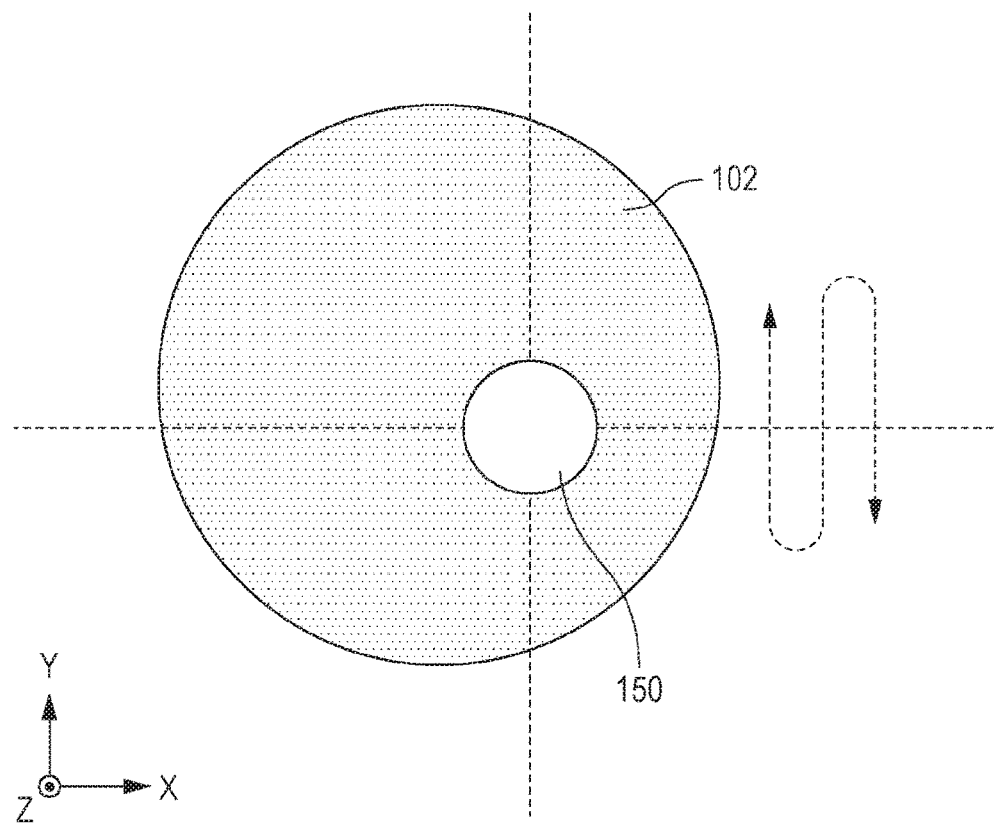
FIG. 3 is a top view of a cleaning member according to Embodiment 1.

FIG. 3 is a top view of the cleaning member 150 according to Embodiment 1. When the substrate chuck 102 is cleaned, a polishing pad 161 (polishing unit) of the cleaning member 150 and the holding surface of the substrate chuck 102 are brought into contact with each other. While keeping such a state, at least one of the substrate chuck 102 and the cleaning member 150 is moved along the X-Y plane so that the polishing pad 161 contacts an entire surface of the substrate chuck 102. Thereby, the foreign substance attached to the holding surface of the substrate chuck 102 is scraped off and removed from the substrate chuck 102.

Here, a plurality of protrusions are formed on the substrate chuck 102 in order to reduce an area, in which the substrate 101 and the substrate chuck 102 contact, so that no foreign substance is held therebetween. The substrate chuck 102 holds the substrate 101 in a state where upper ends of the plurality of protrusions contact the substrate 101. For example, each of the protrusions is approximately 1 mm in a diameter and approximately 0.5 mm in a height from a bottom portion of the chuck, and an arrangement pitch of the protrusions is approximately 5 mm. A size of each of the particles generated by cleaning is several μm or less. Such particles may float in a space between the polishing pad 161 and the bottom portion of the substrate chuck 102. The particles may be attached to side surfaces of the plurality of protrusions formed on the substrate chuck 102 or parts between the plurality of protrusions on a bottom surface of the substrate chuck 102.

Figure 4:
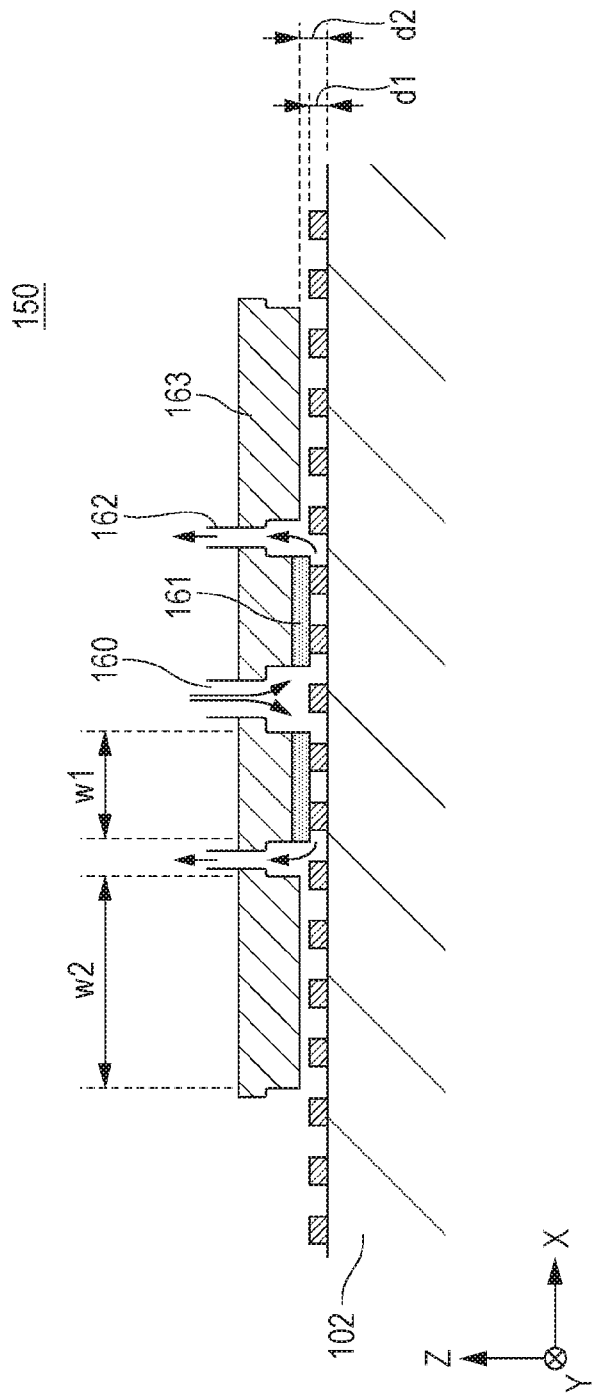
FIG. 4 is a cross-sectional view of the cleaning member according to Embodiment 1.

Thus, the cleaning unit 109 according to the present embodiment supplies the gas to a space between the substrate chuck 102 and the cleaning member 150 to suck the gas from the space between the substrate chuck 102 and the cleaning member 150. Thereby, the particles floating in the space between the polishing pad 161 and the bottom portion of the substrate chuck 102 and the particles attached to the substrate chuck 102 are able to be sucked. FIG. 4 is a cross-sectional view of the cleaning member 150 according to Embodiment 1.

The polishing pad 161 arranged on a lower surface of the cleaning member 150 contacts the substrate chuck 102 to scrape off the foreign substance attached to the substrate chuck 102. Therefore, a groove is formed in the polishing pad 161.

In the cleaning member 150, a supply port 160 through which the gas is supplied to the space between the cleaning member 150 and the substrate chuck 102 and a suction port 162 through which the gas is sucked from the space between the cleaning member 150 and the substrate chuck 102 are formed. In a state where the cleaning member 150 contacts the substrate chuck 102, the supply unit 109a for supplying the gas supplies the gas to the space between the cleaning member 150 and the substrate chuck 102 through the supply port 160. The suction unit 109b for sucking the gas sucks the gas from the space between the cleaning member 150 and the substrate chuck 102 through the suction port 162.

A flat portion 163 is formed around the suction port 162. The flat portion 163 is configured so as not to contact the substrate chuck 102 while the polishing pad 161 contacts the substrate chuck 102. Specifically, a distance d2 from a bottom surface of the substrate chuck 102 to a lower surface of the flat portion 163 is longer than a distance d1 from the bottom surface of the substrate chuck 102 to upper ends of the protrusions in a state where the polishing pad 161 contacts the substrate chuck 102, as illustrated in FIG. 4.

Figure 5:
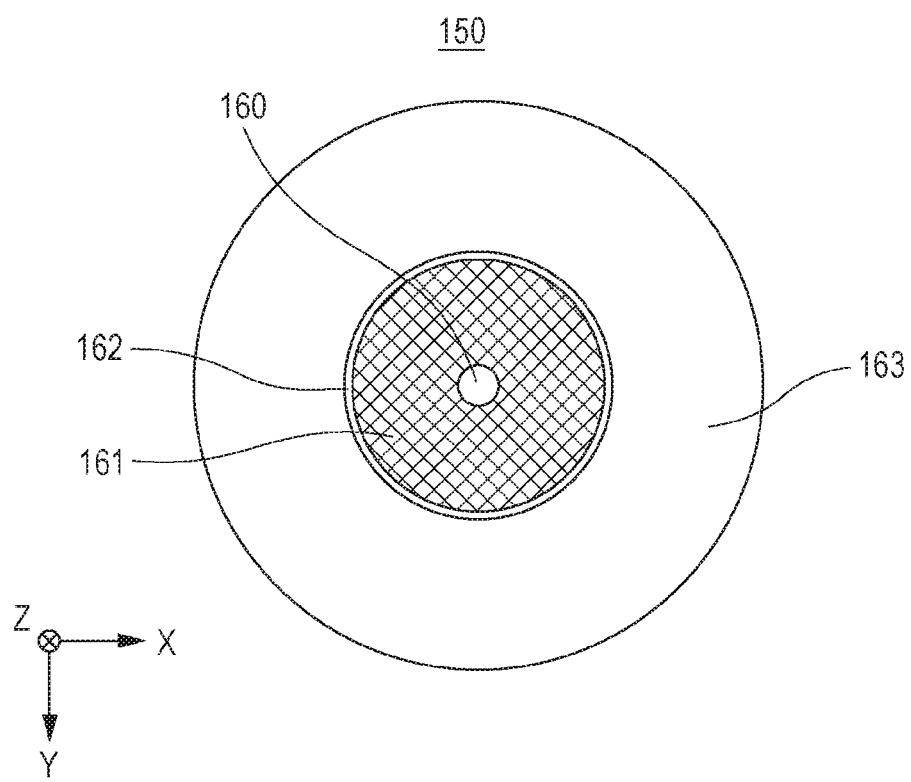
FIG. 5 illustrates a lower surface of the cleaning member according to Embodiment 1.

FIG. 5 illustrates a lower surface of the cleaning member 150 according to Embodiment 1. As illustrated in FIG. 5, the supply port 160 is formed in the center of the cleaning member 150 and the suction port 162 is formed around the supply port 160. Though the suction port 162 is formed in a ring shape so as to surround the supply port 160, the suction port 162 may be constituted by a plurality of suction ports formed around the supply port 160. Moreover, an external shape of the cleaning member 150 illustrated in FIG. 5 is a round shape, but may be another shape such as a rectangular shape or an elliptical shape.

When the gas supplied through the supply port 160 is sucked through the suction port 162, a flow of the gas is generated in the space between the substrate chuck 102 and the cleaning member 150. With the flow of the gas, the particles floating in the space between the polishing pad 161 and the bottom portion of the substrate chuck 102 and the particles attached to the substrate chuck 102 are separated from the substrate chuck 102 and sucked by the suction unit 109b through the suction port 162. Additionally, when the gas in the space between the flat portion 163 and the substrate chuck 102 is sucked through the suction port 162, the sucking of the gas from the supply port 160 to the suction port 162 is hindered. Accordingly, it is desirable to suppress the gas in the space between the flat portion 163 and the substrate chuck 102 being sucked through the suction port 162. Thus, a distance w1 from the supply port 160 to the suction port 162, a distance w2 from an outer periphery of the cleaning member 150 to the suction port 162, the distance d1, and the distance d2 are adjusted.

Here, a conductance C1 indicates easiness of sucking the gas in the space between the polishing pad 161 and the substrate chuck 102 to the suction port 162. A difference $\Delta P1$ is a difference of pressure between the supply port 160 and the suction port 162. A flow rate Q1 is a flow rate of the gas sucked from the space between the cleaning member 150 and the substrate chuck 102 to the suction port 162. C1, $\Delta P1$, and Q1 satisfy a relationship of the following formula (1).

$$Q1 = C1\Delta P1 \quad (1)$$

A conductance C2 indicates easiness of sucking the gas in the space between the flat portion 163 and the substrate chuck 102 to the suction port 162. A difference $\Delta P2$ is a difference between pressure in the periphery of the cleaning member 150 and pressure in the suction port 162. A flow rate Q2 is a flow rate of the gas sucked from the space between the flat portion 163 and the substrate chuck 102 to the suction port 162. C2, $\Delta P2$, and Q2 satisfy a relationship of the following formula (2).

$$Q2 = C2\Delta P2 \quad (2)$$

The conductance C1 is defined by the distance w1 and the distance d1 and the conductance C2 is defined by the distance w2 and the distance d2. Thus, when the distance w1 and the distance d1 are constants, the flow rate Q1 is able to be made greater than the flow rate Q2 by adjusting the distance w2 and the distance d2. The distance w2 and the distance d2 that make the flow rate Q1 greater than the flow rate Q2 are able to be obtained by simulation, an experiment, or the like. Thus, suction of the gas in the space between the flat portion 163 and the substrate chuck 102 through the suction port 162 is suppressed.

By providing the flat portion 163, it is possible to suppress scattering of particles, which are generated by polishing with the polishing pad 161, to the periphery of the cleaning member 150 through the space between the flat portion 163 and the substrate chuck 102.

Figure 6:
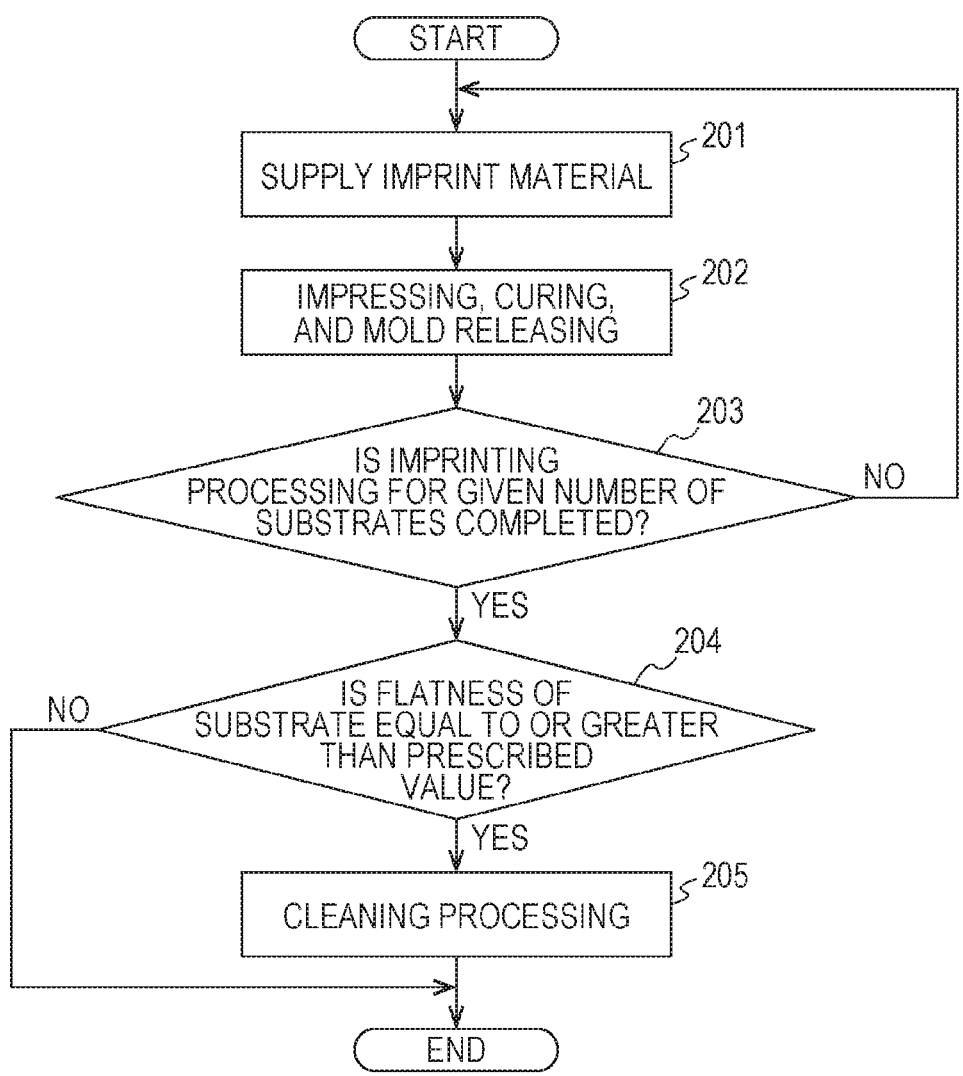
FIG. 6 is a flowchart of imprinting processing and cleaning processing according to Embodiment 1.

Next, imprinting processing and cleaning processing will be described. FIG. 6 is a flowchart of the imprinting processing and the cleaning processing. When the imprinting processing starts, at step S201, the fine-movement stage 114 and the coarse-movement stage 115 are moved, so that the substrate 101 is positioned below the liquid ejection device 111 and the liquid ejection device 111 supplies an imprint material onto the substrate 101. Next, at step S202, the mold holding device 110, the fine-movement stage 114, and the coarse-movement stage 115 are moved so that the mold 100 is brought into contact with (impressed against) the imprint material on the substrate 101. Then, the irradiation unit 104 irradiates the imprint material with light to cure the imprint material. Then, the mold 100 and the imprint material on the substrate 101 are separated (released) from each other. At step S203, the main control unit 127 determines whether or not the imprinting processing for the given number of substrates 101 is completed. When not completed, the procedure returns to step S201. When completed, the procedure moves to step S204.

At step S204, the main control unit 127 determines whether or not a value indicating flatness of the substrate 101 in a state of being held by the substrate chuck 102 is a prescribed value (predetermined value) or more. The value indicating the flatness is, for example, a P-V value or the like. Here, the flatness of the substrate 101 is periodically measured at any timing and stored in a storage unit of the main control unit 127. In a case where the flatness of the substrate 101 is not the prescribed value or more, the imprinting processing ends. In a case where the flatness of the substrate 101 is the prescribed value or more, the procedure moves to step S205 to perform cleaning processing.

Figure 7:
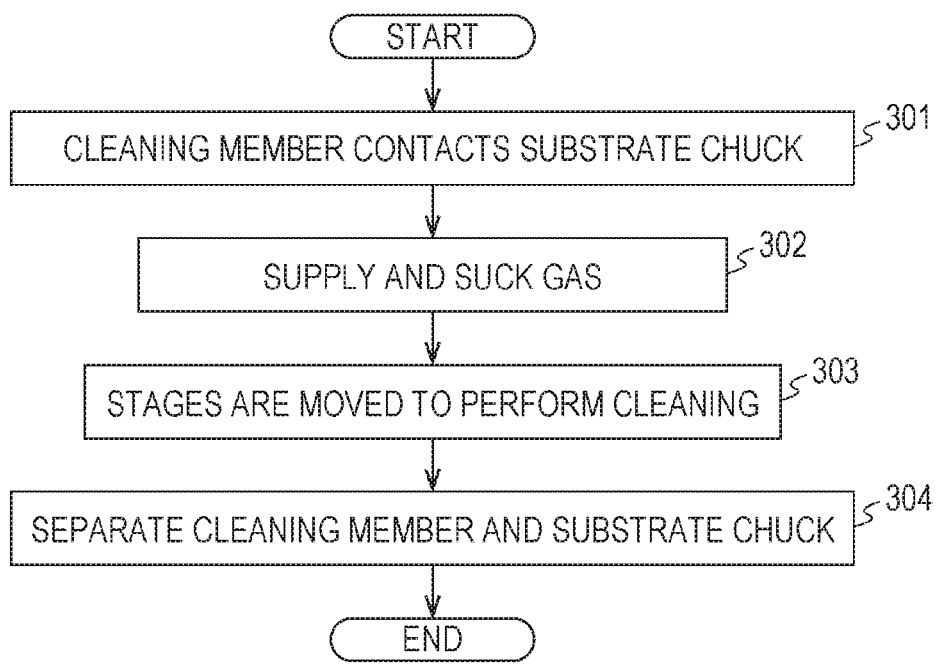
FIG. 7 is a flowchart of cleaning processing according to Embodiment 1.

Here, the cleaning processing will be described in detail. FIG. 7 is a flowchart of the cleaning processing. When the cleaning processing starts, at step S301, the fine-movement stage 114 and the coarse-movement stage 115 are moved, so that the substrate chuck 102 is positioned below the cleaning unit 109. Then, the cleaning member 150 is moved downwardly and the holding surface of the substrate chuck 102 contacts the polishing pad 161 of the cleaning member 150. At step S302, the gas is supplied by the supply unit 109a through the supply port 160 to the space between the cleaning member 150 and the substrate chuck 102. Additionally, the gas is sucked by the suction unit 109b from the space between the cleaning member 150 and the substrate chuck 102 through the suction port 162. At step S303, the fine-movement stage 114 and the coarse-movement stage 115 are moved in the X-Y plane, so that the substrate chuck 102 is polished by the polishing pad 161 and cleaned. At step S304, when the cleaning member 150 moves upwardly, the polishing pad 161 and the substrate chuck 102 are separated from each other and the cleaning processing ends.

As above, with the imprint apparatus according to the present embodiment, the substrate chuck is cleaned while supplying the gas to the space between the substrate chuck and the cleaning member and sucking the gas from the space between the substrate chuck and the cleaning member. This makes it possible to efficiently remove the particles generated by cleaning of the substrate chuck.

[Embodiment 2]

Next, an imprint apparatus according to Embodiment 2 will be described. Note that, matters not described in the present embodiment can follow the description of Embodiment 1.

Figure 8:
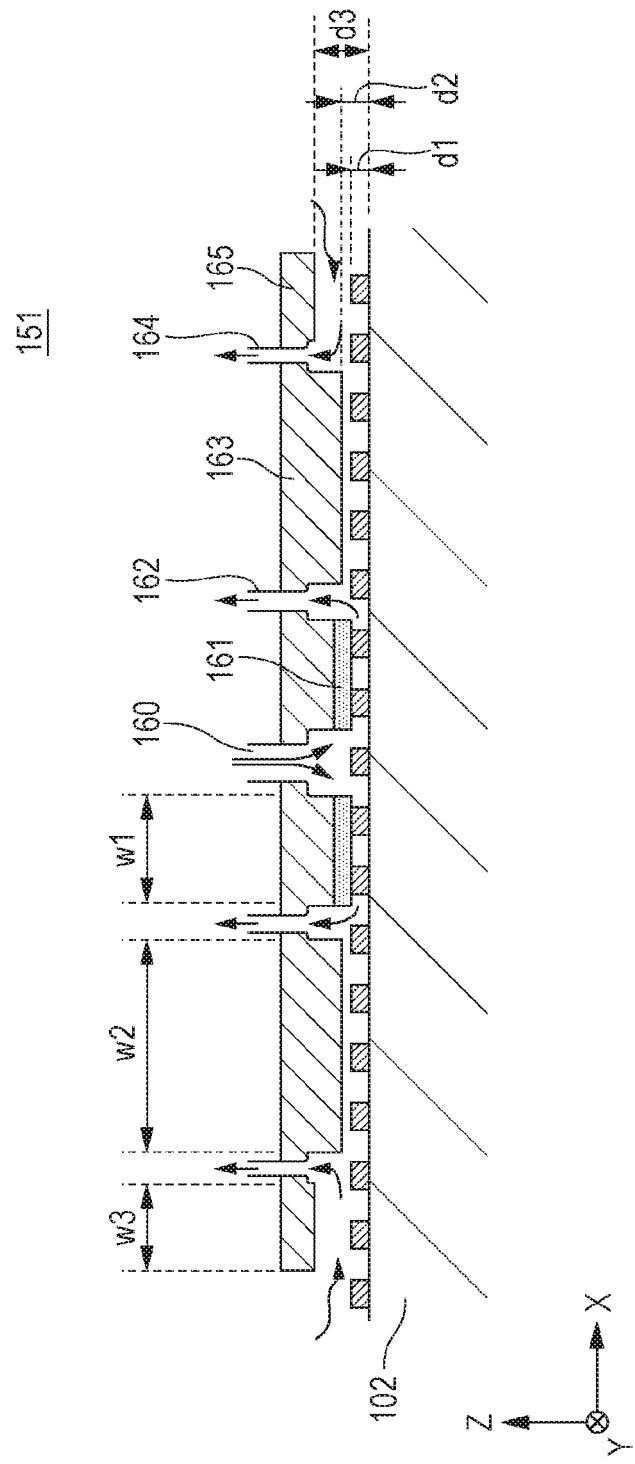
FIG. 8 is a cross-sectional view of a cleaning member according to Embodiment 2.
Figure 9:
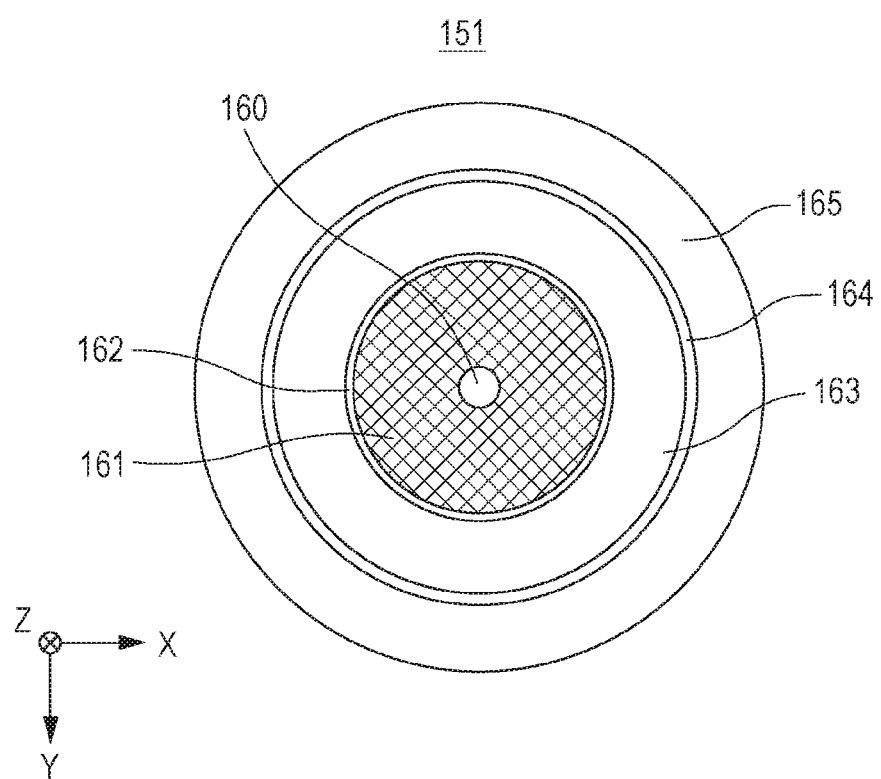
FIG. 9 is a plan view of the cleaning member according to Embodiment 2.

FIG. 8 is a cross-sectional view of a cleaning member and a substrate chuck according to Embodiment 2. FIG. 9 is a plan view of the cleaning member according to Embodiment 2. A cleaning member 151 according to the present embodiment is different from the cleaning member 150 according to Embodiment 1 in that a second suction port 164 is arranged in a periphery of the flat portion 163 and a second flat portion 165 is arranged in a periphery of the second suction port 164.

The gas in the periphery of the cleaning member 151 and the gas in a space between the flat portion 163 and the substrate chuck 102 are sucked through the second suction port 164. Thereby, it is possible to suppress scattering of particles, which are generated by polishing with the polishing pad 161, to the periphery of the cleaning member 151 through the space between the flat portion 163 and substrate chuck 102.

Further, the second flat portion 165 is arranged in the periphery of the second suction port 164. This makes it possible to make a flow rate of the gas sucked from a space between the second flat portion 165 and the substrate chuck 102 to the second suction port 164 greater than a flow rate of the gas sucked from the space between the flat portion 163 and the substrate chuck 102 to the second suction port 164. Thereby, it is possible to suppress scattering of particles, which are generated by polishing with the polishing pad 161, to the periphery of the cleaning member 151 through the space between the flat portion 163 and the substrate chuck 102.

Here, a distance d3 is a distance from the bottom surface of the substrate chuck 102 to a lower surface of the second flat portion 165. A distance d2 is a distance from the bottom surface of the substrate chuck 102 to the lower surface of the flat portion 163. A distance w2 is a distance from the suction port 162 to the second suction port 164. A distance w3 is a distance from the outer periphery of the cleaning member 151 to the second suction port 164. A conductance C3 indicates easiness of sucking the gas in the space between the flat portion 163 and the substrate chuck 102 to the second suction port 164. A difference ΔP3 is a difference of pressure between the suction port 162 and the second suction port 164. A flow rate Q3 is a flow rate of the gas sucked from the space between the flat portion 163 and the substrate chuck 102 to the second suction port 164. C3, ΔP3, and Q3 satisfy a relationship of the following formula (3).

$$Q3=C3\Delta P3 \quad (3)$$

A conductance C4 indicates easiness of sucking the gas in the space between the second flat portion 165 and the substrate chuck 102 to the second suction port 164. A difference ΔP4 is a difference between pressure in the periphery of the cleaning member 151 and pressure in the second suction port 164. A flow rate Q4 is a flow rate of the gas sucked from the space between the second flat portion 165 and the substrate chuck 102 to the second suction port 164. C4, ΔP4, and Q4 satisfy a relationship of the following formula (4).

$$Q4=C4\Delta P4 \quad (4)$$

The conductance C3 is defined by the distance w2 and the distance d2 and the conductance C4 is defined by the distance w3 and the distance d3. Thus, when the distance w2 and the distance d2 are constants, the flow rate Q4 is able to be made greater than the flow rate Q3 by adjusting the distance w3 and the distance d3. The distance w3 and the distance d3 that make the flow rate Q4 greater than the flow rate Q3 are able to be obtained by simulation, an experiment, or the like.

Note that, a configuration may be such that the gas is sucked through the suction port 162 and the second suction port 164 while the supply port 160 of the cleaning member 151 is exposed to the atmosphere. When the gas is sucked through the suction port 162 and the second suction port 164, the gas in the space between the substrate chuck 102 and the polishing pad 161 is sucked to the suction port 162 or the second suction port 164. Then, the particles floating in the space between the polishing pad 161 and the bottom portion of the substrate chuck 102 and the particles attached to the substrate chuck 102 are able to be removed.

As above, with the imprint apparatus according to the present embodiment, the substrate chuck is cleaned while supplying the gas to the space between the substrate chuck and the cleaning member and sucking the gas from the space between the substrate chuck and the cleaning member. This makes it possible to efficiently remove the particles generated by cleaning of the substrate chuck.

By arranging the second suction port in the periphery of the flat portion and the second flat portion in the periphery of the second suction port, it is possible to suppress scattering of particles to the periphery of the cleaning member through the space between the flat portion and the substrate chuck.

[Embodiment 3]

Next, an imprint apparatus according to Embodiment 3 will be described. Note that, matters not described in the present embodiment can follow the description of Embodiment 1.

A large portion of the particles generated by polishing with the polishing pad 161 is removed by supplying the gas to the space between the substrate chuck 102 and the cleaning member 150 and sucking the gas from the space between the substrate chuck 102 and the cleaning member 150. However, a part of the particles may be attached to the substrate chuck 102 again and attached to side surfaces of the plurality of protrusions formed on the substrate chuck 102 or parts between the plurality of protrusions on the bottom surface of the substrate chuck 102 without being removed by supplying or sucking of the gas. The particles may be also attached to the polishing pad 161. After being separated from the substrate chuck 102 after the end of the cleaning processing, the particles attached to the polishing pad 161 may drift in a space inside the imprint apparatus 1 and be attached onto the substrate 101 or to the pattern portion of the mold 100.

Figure 10:
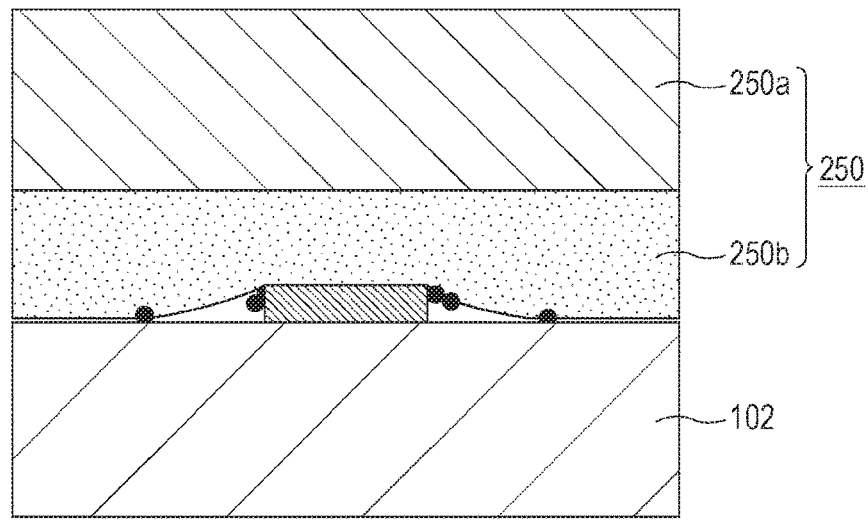
FIG. 10 is a cross-sectional view of a second cleaning member according to Embodiment 3.

Thus, a cleaning member according to the present embodiment includes an adhesive member and attracts particles remaining in the substrate chuck 102 or the polishing pad 161 by the adhesive member to remove the particles. FIG. 10 is a cross-sectional view of a second cleaning member according to Embodiment 3. In a cleaning member 250 (second cleaning member), an adhesive member 250b having adhesiveness is provided on a lower surface of a member 250a having a similar shape to that of the substrate 101. The cleaning member 250 is conveyed to the holding surface of the substrate chuck 102 and the adhesive member 250b is brought into contact with the substrate chuck 102 for attraction. The adhesive member 250b has modulus of elasticity lower than those of the plurality of protrusions formed on the substrate chuck 102 and has flexibility, and is thus deformed along shapes of the protrusions. When the adhesive member 250b contacts particles and the particles are attached to the adhesive member 250b, the particles are able to be removed from the substrate chuck 102. Here, a resin material such as polyimide is able to be used for the adhesive member 250b.

Figure 11:
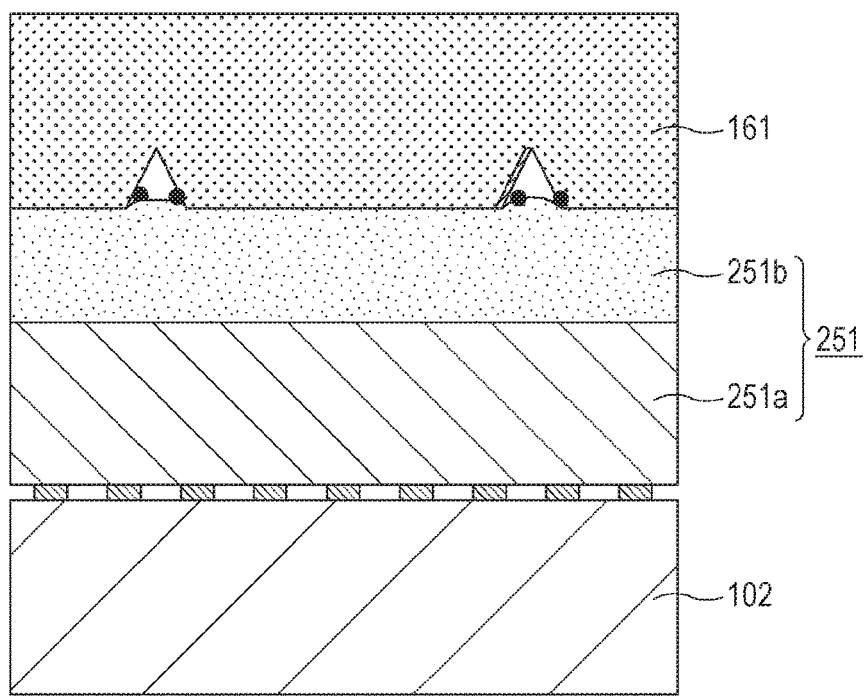
FIG. 11 is a cross-sectional view of a third cleaning member according to Embodiment 3.

FIG. 11 is a cross-sectional view of a third cleaning member according to Embodiment 3. In a cleaning member 251 (third cleaning member), an adhesive member 251b having adhesiveness is provided on an upper surface of a member 251a having a similar shape to that of the substrate 101. The cleaning member 251 is conveyed to the holding surface of the substrate chuck 102 for attraction. Then, the adhesive member 251b is brought into contact with the polishing pad 161. The adhesive member 251b has modulus of elasticity lower than that of the groove formed in the polishing pad 161 and has flexibility, and is thus deformed along a shape of the groove. When the adhesive member 251b contacts particles and the particles are attached to the adhesive member 251b, the particles are able to be removed from the polishing pad 161.

Figure 12:
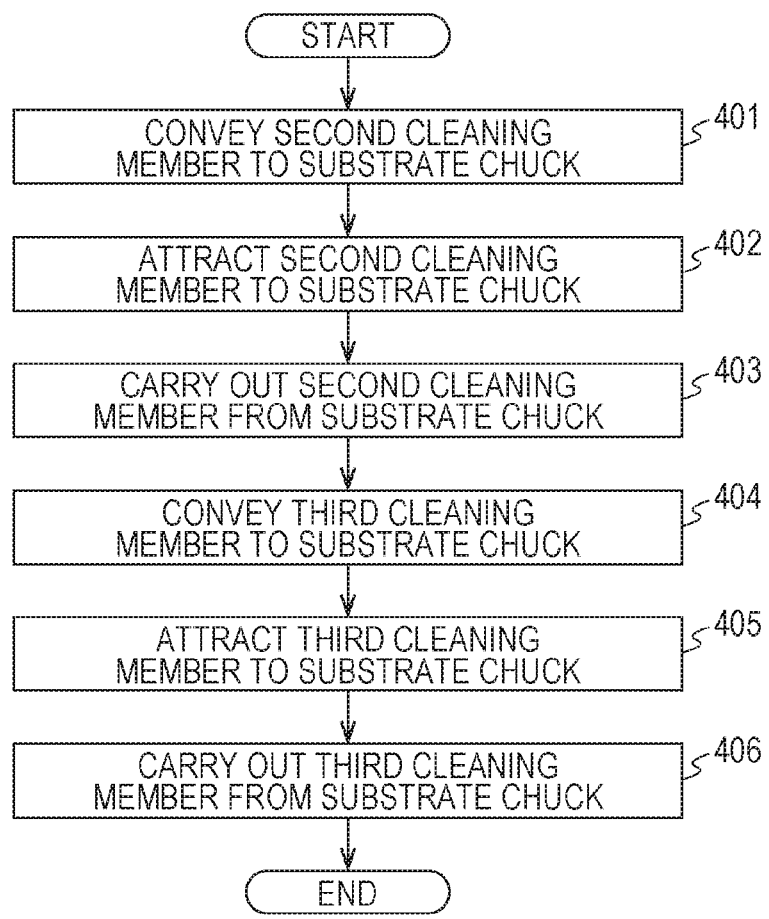
FIG. 12 is a flowchart of second cleaning processing according to Embodiment 3.

FIG. 12 is a flowchart of second cleaning processing according to Embodiment 3. After the cleaning processing according to Embodiment 1 is executed, the second cleaning processing according to the present embodiment is executed. When the second cleaning processing starts, the cleaning member 250 is conveyed to the substrate chuck 102 at step S401. The adhesive member 250b is brought into contact with the substrate chuck 102 for attraction at step S402. The cleaning member 250 is carried out from the substrate chuck 102 at step S403. Thereby, particles attached to the substrate chuck 102 are able to be attracted to the adhesive member 250b and removed.

Next, the cleaning member 251 is conveyed to the substrate chuck 102 at step S404. The polishing pad 161 is brought into contact with the adhesive member 251b and the polishing pad 161 is separated from the adhesive member 251b at step S405. At step S406, the cleaning member 251 is carried out from the substrate chuck 102. Thereby, particles attached to the polishing pad 161 are able to be attracted to the adhesive member 251b and removed. Note that, the cleaning member 250 may be turned upside down to be conveyed as the cleaning member 251 at step S404.

Figure 13:
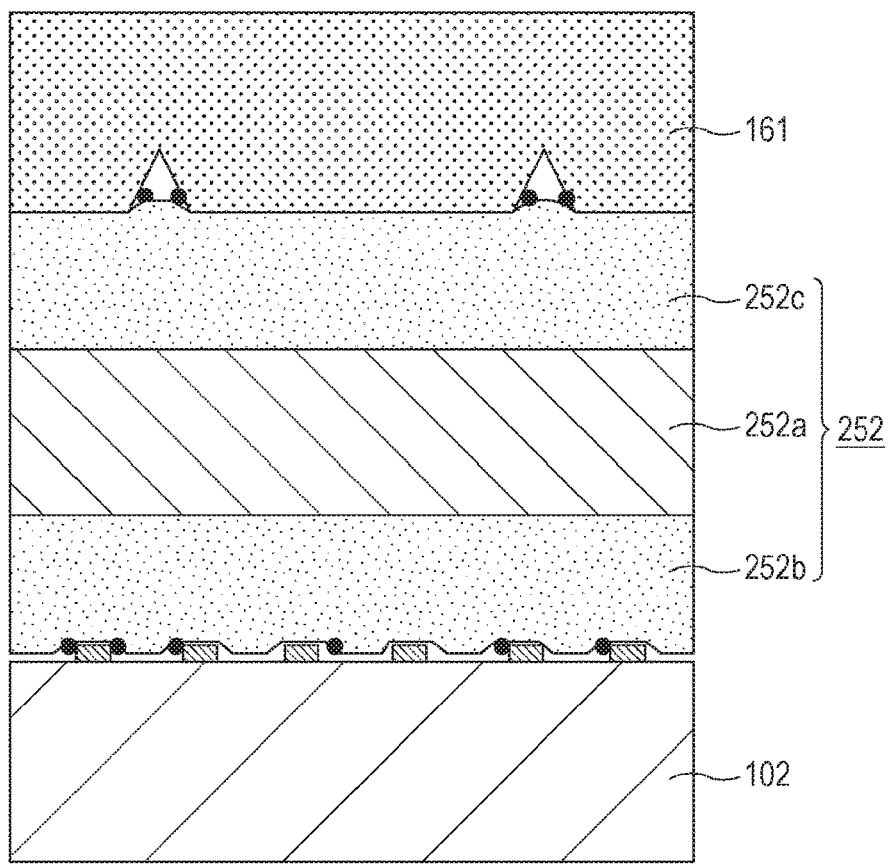
FIG. 13 is a cross-sectional view of a fourth cleaning member according to Embodiment 3.
Figure 14:
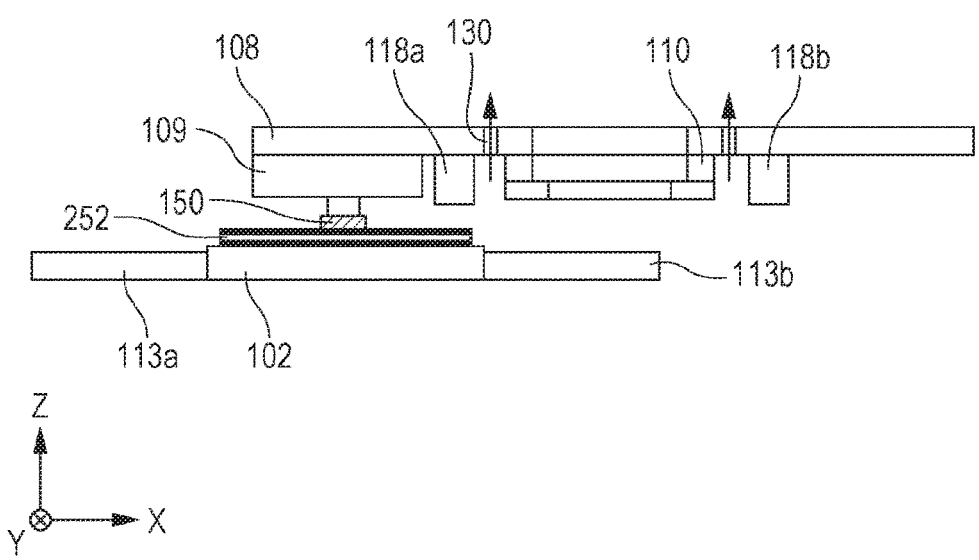
FIG. 14 illustrates the fourth cleaning member conveyed to a substrate chuck.

In the flowchart illustrated in FIG. 12, however, it takes time because the cleaning member 250 and the cleaning member 251 need to be conveyed. Thus, by disposing adhesive members on an upper surface and a lower surface of a cleaning member, a time of cleaning is able to be shortened. FIG. 13 is a cross-sectional view of a fourth cleaning member according to Embodiment 3. FIG. 14 illustrates the fourth cleaning member conveyed to the substrate chuck 102. In a cleaning member 252 (fourth cleaning member), an adhesive member 252b having adhesiveness and an adhesive member 252c having adhesiveness are respectively provided on a lower surface and an upper surface of a member 252a having a similar shape to that of the substrate 101. The cleaning member 252 is conveyed to the holding surface of the substrate chuck 102 and the adhesive member 252b is brought into contact with the substrate chuck 102 for attraction. Then, the adhesive member 252c is brought into contact with the polishing pad 161. The adhesive member 252b has modulus of elasticity lower than those of the plurality of protrusions formed on the substrate chuck 102 and has flexibility, and is thus deformed along the shapes of the protrusions. When the adhesive member 252b contacts particles and the particles are attached to the adhesive member 252b, the particles are able to be removed from the substrate chuck 102. Moreover, the adhesive member 252c has modulus of elasticity lower than that of the groove formed in the polishing pad 161 and has flexibility, and is thus deformed along a shape of the groove. When the adhesive member 252c contacts particles and the particles are attached to the adhesive member 252c, the particles are able to be removed from the polishing pad 161. Accordingly, use of the cleaning member 252 makes it possible to shorten a time of the cleaning processing.

As above, with the imprint apparatus according to the present embodiment, the substrate chuck is cleaned while supplying the gas to the space between the substrate chuck and the cleaning member and sucking the gas from the space between the substrate chuck and the cleaning member. This makes it possible to efficiently remove the particles generated by cleaning of the substrate chuck.

Further, by using the cleaning member having the adhesive members, the substrate chuck and the polishing pad of the cleaning member are cleaned. Thereby, particles that are not removed by supplying or sucking of the gas and remains on the substrate chuck and the polishing pad of the cleaning member are able to be removed.

(Method of Manufacturing Article)

A pattern of a cured product that is formed by using the imprint apparatus is used permanently for at least a part of various articles or used temporarily when the various articles are manufactured. Examples of an article include an electric circuit element, an optical element, a MEMS, a recording element, a sensor, a mold, and the like. Examples of the electric circuit element include a volatile or nonvolatile semiconductor memory, such as a DRAM, an SRAM, a flash memory, or an MRAM, and a semiconductor element, such as an LSI, a CCD, an image sensor, and an FPGA. An example of the mold includes an imprinting mold.

The pattern of the cured product is used directly as a constituent member of at least a part of the aforementioned article or used temporarily as a resist mask. The resist mask is removed after etching, ion implantation, or the like is performed in a processing step of the substrate.

Figure 15A:
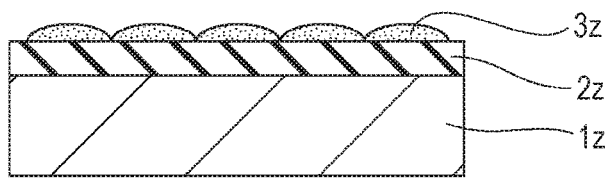
FIGS. 15A to 15F are views for explaining a method of manufacturing an article.

Next, a specific method of manufacturing an article will be described. As illustrated in FIG. 15A, a substrate 1z, such as a silicon wafer, having a processing target material 2z, such as an insulator, formed on a surface thereof is prepared, and subsequently, an imprint material 3z is applied on a surface of the processing target material 2z by an inkjet method or the like. A state in which the imprint material 3z formed into a plurality of droplets is applied on the substrate is indicated here.

Figure 15B:
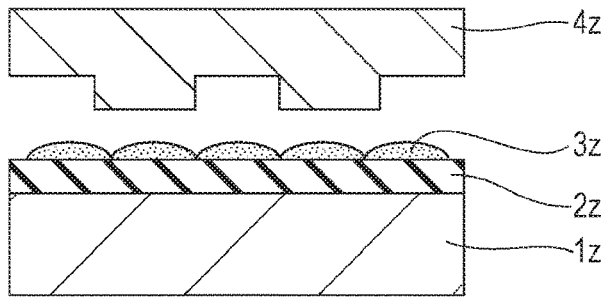
Figure 15C:
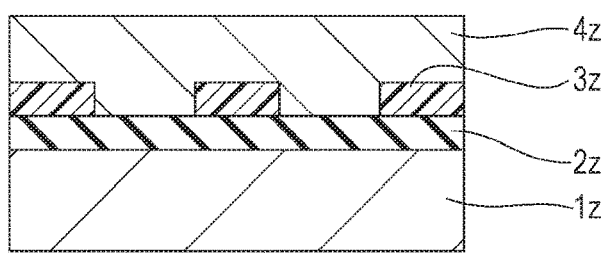

As illustrated in FIG. 15B, a side of an imprinting mold 4z, on which its concave-convex pattern is formed, faces the imprint material 3z on the substrate 1z. As illustrated in FIG. 15C, the mold 4z and the substrate 1z to which the imprint material 3z is applied are brought into contact with each other, and pressure is applied. The imprint material 3z fills a gap between the mold 4z and the processing target material 2z. The imprint material 3z is cured by irradiation with light as curing energy through the mold 4z in such a state.

Figure 15D:
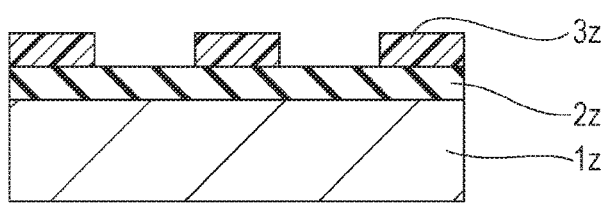

As illustrated in FIG. 15D, when the mold 4z and the substrate 1z are separated from each other after the imprint material 3z is cured, the pattern of the cured product of the imprint material 3z is formed on the substrate 1z. The pattern of the cured product has a shape such that a concave portion of the mold 4z corresponds to a convex portion of the cured product and a convex portion of the mold 4z corresponds to a concave portion of the cured product. That is, the concave-convex pattern of the mold 4z is transferred to the imprint material 3z.

Figure 15E:
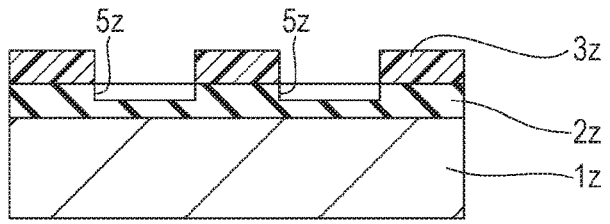
Figure 15F:
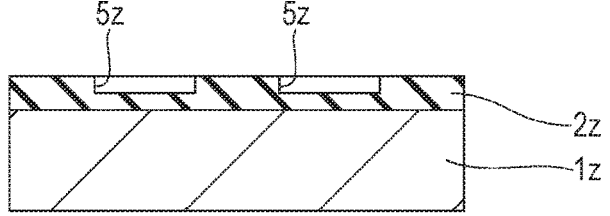
Figure 16:
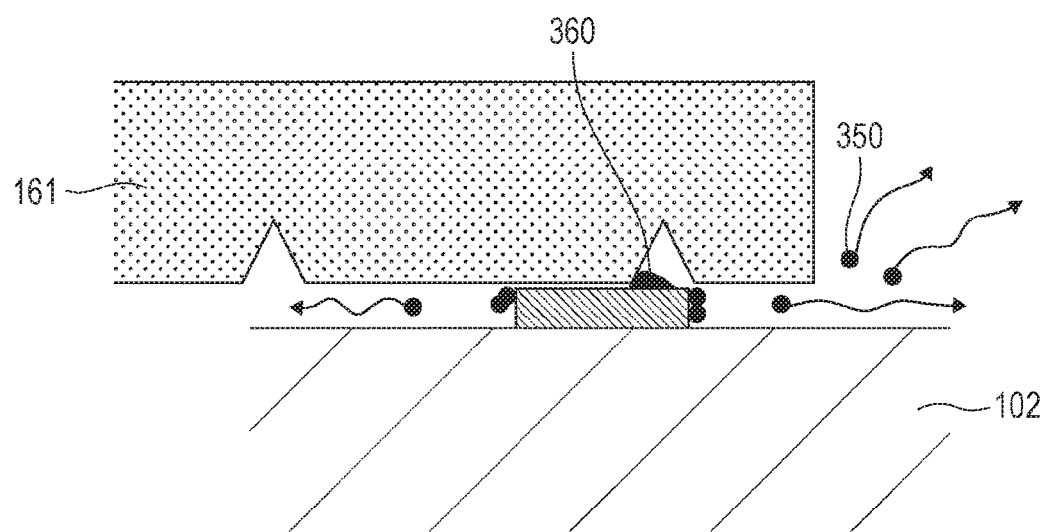
FIG. 16 is a cross-sectional view of a substrate chuck and a cleaning member.

As illustrated in FIG. 15E, when etching is performed by using the pattern of the cured product as an etching resistant mask, out of the surface of the processing target material 2z, a portion without the cured product or a portion where the cured product remains thin is removed and a trench 5z is provided. As illustrated in FIG. 15F, by removing the pattern of the cured product, an article having the trench 5z formed on the surface of the processing target material 2z is able to be obtained. The pattern of the cured product is removed here, but may be utilized as, for example, an interlayer dielectric film included in a semiconductor element or the like, that is, as a constituent member of the article without removing the pattern even after processing.

While the desirable embodiments of the disclosure have been described above, it is to be understood that the invention is not limited to the embodiments and various modification and changes are possible within a scope of the gist of the invention. Though an imprint apparatus that forms a pattern on a substrate by forming (molding) an imprint material on the substrate with use of a mold has been described as an example of a lithography apparatus, the lithography apparatus is not limited to the imprint apparatus.

An example of the lithography apparatus may be an apparatus, such as a drawing apparatus that performs drawing on a substrate with a charged-particle beam (electron beam, ion beam, or the like) via a charged-particle optical system to form a pattern on the substrate. An example of the lithography apparatus may be an exposure apparatus that exposes a substrate to form a pattern. A manufacturing apparatus that performs a step other than steps performed by the lithography apparatus as described above in manufacturing an article, such as a device, may be also included and examples thereof include a coating apparatus that coats a surface of a substrate with a photosensitive medium, and a developing apparatus that develops a substrate on which a pattern is transferred.

Embodiments 1 through 3 may be carried out not only separately but in combination of at least two of Embodiments 1 through 3.

According to the disclosure, it is possible to provide a lithography apparatus capable of efficiently removing particles generated by cleaning of a substrate chuck and a method of manufacturing an article.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-162178 filed Aug. 25, 2017, which is hereby incorporated by reference herein in its entirety.

What is claimed is:

1. A lithography apparatus for forming a pattern on a substrate, the lithography apparatus comprising:
　a holding unit configured to hold the substrate on a holding surface; and
　a cleaning member including a polishing unit and configured to bring the polishing unit into contact with the holding surface to clean the holding surface, wherein the cleaning member includes a supply port which is arranged in the polishing unit and through which gas is supplied, and a suction port which is arranged in a periphery of the polishing unit and through which gas is sucked,
　wherein the cleaning member includes a flat portion that is arranged in a periphery of the polishing unit,
　wherein the flat portion includes a surface that is in parallel along the holding surface and separated from the holding surface while the polishing unit contacts the holding surface.

2. The lithography apparatus according to claim 1, further comprising
　a supply unit configured to supply the gas through the supply port to a space between the cleaning member and the holding unit, the space being formed in a state where the polishing unit contacts the holding unit, and
　a suction unit configured to suck the gas from the space through the suction port.

3. The lithography apparatus according to claim 2, wherein
　a flow rate of the gas sucked by the suction unit from a second space between the polishing unit and the holding unit is greater than a flow rate of the gas sucked by the suction unit from a first space between the flat portion and the holding unit, the first space being formed in a state where the cleaning member contacts the holding unit and the second space being formed in a state where the cleaning member contacts the holding unit.

4. The lithography apparatus according to claim 2, wherein
　the cleaning member includes a second suction port in a periphery of the suction port, and the suction unit is configured to suck the gas through the second suction port.

5. The lithography apparatus according to claim 4, wherein
the cleaning member includes a second flat portion that is arranged in a periphery of the second suction port,
wherein the second flat portion includes a second surface that is in parallel along the holding surface and separated from the holding surface while the polishing unit contacts the holding surface.

6. The lithography apparatus according to claim 5, wherein
a flow rate of the gas sucked by the suction unit from the first space between the flat portion and the holding unit is greater than a flow rate of the gas sucked by the suction unit from a third space between the second flat portion and the holding unit, the first space being formed in a state where the cleaning member contacts the holding unit and the third space being formed in a state where the cleaning member contacts the holding unit.

7. The lithography apparatus according to claim 1, wherein
at least any one of the cleaning member and the holding unit is moved with the holding surface and the polishing unit in contact with each other and the holding surface is cleaned.

8. The lithography apparatus according to claim 1, wherein
after the holding surface is cleaned by the cleaning member, the holding surface is cleaned by an adhesive member.

9. The lithography apparatus according to claim 1, wherein
after the holding surface is cleaned by the cleaning member, the cleaning member is cleaned by an adhesive member.

10. The lithography apparatus according to claim 1, wherein
the holding unit includes a plurality of protrusions that forms the holding surface.

11. The lithography apparatus according to claim 1, wherein
the supply port is arranged in a center of the polishing unit.

12. A method of manufacturing an article, the method comprising:
cleaning a holding surface on which a holding unit configured to hold a substrate, the holding unit being included in a lithography apparatus that forms a pattern on the substrate;
forming a pattern on the substrate by using the lithography apparatus;
processing the substrate on which the pattern is formed through the pattern forming; and
manufacturing an article by using the substrate that is processed, wherein
the lithography apparatus includes:
the holding unit; and
a cleaning member including a polishing unit and configured to bring the polishing unit into contact with the holding surface to clean the holding surface, and
the cleaning member includes:
a supply port which is arranged in the polishing unit and through which gas is supplied; and
a suction port which is arranged in a periphery of the polishing unit and thorough which gas is sucked,
wherein the cleaning member includes a flat portion that is arranged in a periphery of the polishing unit, and
wherein the flat portion includes a surface that is in parallel along the holding surface and separated from the holding surface while the polishing unit contacts the holding surface.

* * * * *